United States Patent
Cok et al.

(10) Patent No.: US 7,855,508 B2
(45) Date of Patent: Dec. 21, 2010

(54) LED DEVICE HAVING IMPROVED LIGHT OUTPUT

(75) Inventors: Ronald S. Cok, Rochester, NY (US); Paul J. Kane, Rochester, NY (US); Michael E. Miller, Honeoye Falls, NY (US)

(73) Assignee: Global OLED Technology LLC, Herndon, VA (US)

( * ) Notice: Subject to any disclaimer, the term of this patent is extended or adjusted under 35 U.S.C. 154(b) by 505 days.

(21) Appl. No.: 11/856,121

(22) Filed: Sep. 17, 2007

(65) Prior Publication Data

US 2009/0072693 A1  Mar. 19, 2009

(51) Int. Cl.
   *H01L 51/00* (2006.01)
(52) U.S. Cl. ..................... 313/506; 313/504
(58) Field of Classification Search .......... 313/498–512
See application file for complete search history.

(56) References Cited

U.S. PATENT DOCUMENTS

| | | | |
|---|---|---|---|
| 5,554,911 A | 9/1996 | Nakayama et al. | |
| 5,949,187 A | 9/1999 | Xu et al. | |
| 6,384,529 B2 | 5/2002 | Tang et al. | |
| 6,861,800 B2 | 3/2005 | Tyan et al. | |
| 6,919,681 B2 | 7/2005 | Cok et al. | |
| 6,987,355 B2 | 1/2006 | Cok | |
| 7,030,553 B2 | 4/2006 | Winters et al. | |
| 7,189,238 B2 | 3/2007 | Lombardo et al. | |
| 2005/0073228 A1 | 4/2005 | Tyan et al. | |
| 2005/0225232 A1* | 10/2005 | Boroson et al. | 313/504 |
| 2005/0280364 A1* | 12/2005 | Omura et al. | 313/506 |
| 2006/0066228 A1 | 3/2006 | Antoniadis | |
| 2007/0046180 A1 | 3/2007 | Kao et al. | |

FOREIGN PATENT DOCUMENTS

| | | |
|---|---|---|
| EP | 1 032 045 | 8/2000 |
| JP | 2008-218366 | 9/2008 |
| WO | WO 2005/101541 | 10/2005 |

OTHER PUBLICATIONS

Kashiwabara, Mitsuhiro et al., "29.5L: Late-News Paper: Advanced AM-OLED Display Based on White Emitter with Microcavity Structure," 2004 SID International Symposium, Seattle, WA, May 25-27, 2004, [SID International Symposium], San Jose, CA : SID, US, vol. XXXV, May 25, 2004, pp. 1017-1019.

* cited by examiner

*Primary Examiner*—Anne M Hines
(74) *Attorney, Agent, or Firm*—Morgan Lewis & Bockius LLP

(57) ABSTRACT

A white light-emitting microcavity light-emitting diode device including a reflective electrode and a semi-transparent electrode formed over a substrate and an unpatterned white-light-emitting layer formed between the reflective electrode and the semi-transparent electrode. The reflective electrode, semi-transparent electrode, and unpatterned white-light-emitting layer form an optical cavity, and either the reflective or semi-transparent electrode is patterned to form independently-controllable light-emitting sub-pixel elements. Color filters are formed over a side of the semi-transparent electrodes opposite the unpatterned white light-emitting-layer in correspondence with the independently-controllable light-emitting elements to form colored sub-pixels. One of the independently-controllable light-emitting element has at least two commonly-controlled portions that together emit substantially white light to form a white sub-pixel. The optical cavity of one or more of the commonly-controlled portions of the white sub-pixel comprises optical microcavities tuned to emit light at a different complementary wavelength at an emission angle.

22 Claims, 12 Drawing Sheets

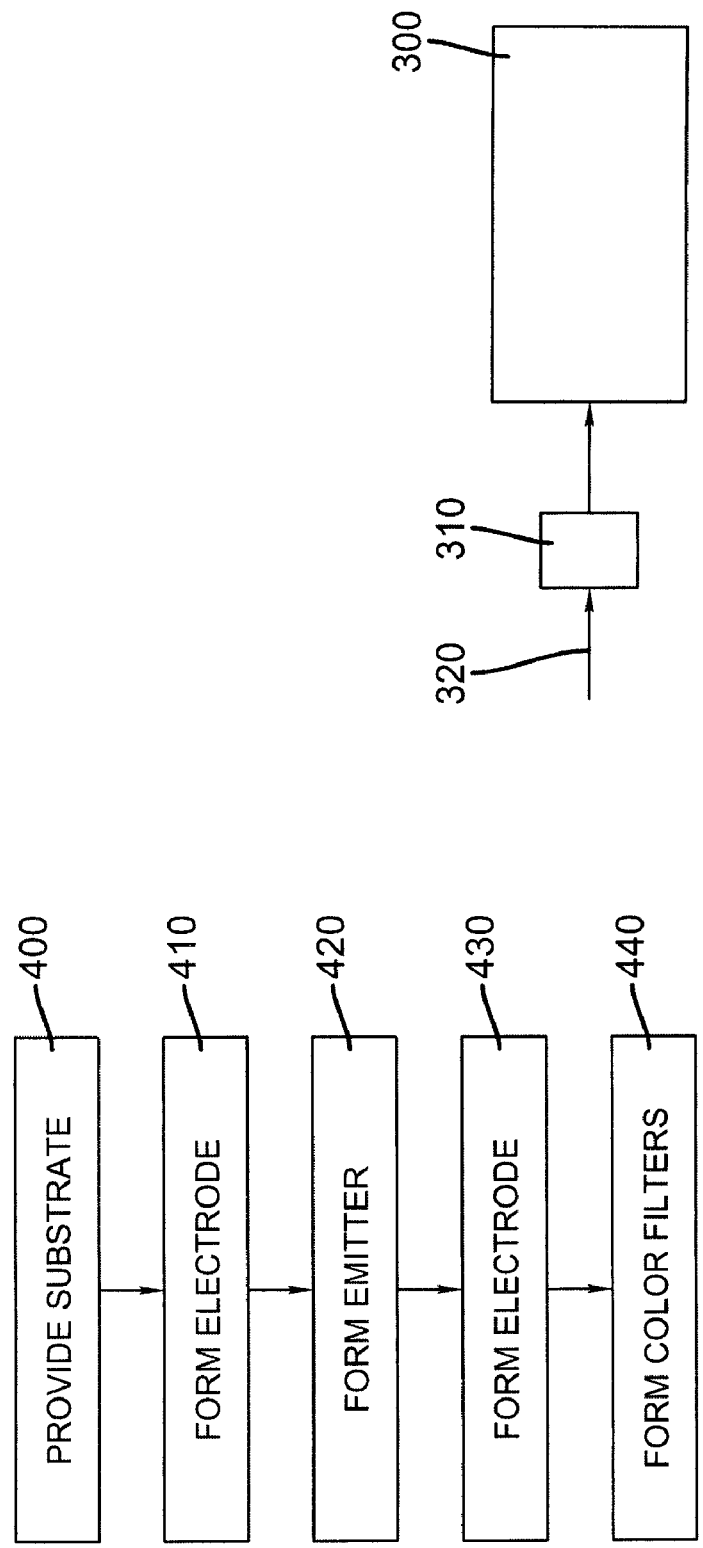

LED DEVICE HAVING IMPROVED LIGHT OUTPUT

FIELD OF THE INVENTION

The present invention relates to light-emitting diode (LED) devices, and more particularly, to LED device structures for improving light output, ambient contrast ratio, and manufacturability.

BACKGROUND OF THE INVENTION

Emissive flat-panel display devices are widely used in conjunction with computing devices and in particular with portable devices. These displays are often used in public areas with significant ambient illumination and are viewed from a wide variety of angles.

Organic light emitting diodes (OLED) have many advantages in a flat-panel display device and are useful in optical systems. U.S. Pat. No. 6,384,529 issued May 7, 2002 to Tang et al. shows an OLED color display that includes an array of OLED light emitting elements (pixels). Light is emitted from a pixel when a current is passed through an organic material, the frequency of the light is dependent on the nature of the organic material used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency.

Optical cavity structures are known to increase the light emitted from an OLED device structure. Such optical cavity structures are also known as microcavities or optical microcavities when formed in thin films. When formed in LED devices, different color light-emitting organic materials are pattern-wise deposited over a substrate between a reflective electrode and a semi-transparent electrode. Light emitters having different colors are thus formed within an optical cavity tuned to a desired peak wavelength of light, typically corresponding to the color of light emitted by the patterned organic materials. U.S. Pat. No. 6,680,570 describes an organic light-emitting device with improved color control employing spacer layers to form an optical cavity. FIG. 9 illustrates such a prior-art, active-matrix, bottom-emitting optical cavity device employing a substrate 10 with active-matrix thin-film components 30, planarization structures 32 and 34, and a semitransparent electrode 16. Patterned organic materials 14R, 14G, and 14B, providing red, green, and blue light emission, are deposited in a light-emitting layer 14. Optical spacers 26R, 26G, and 26B are employed to form optical cavities 60, 62, and 64 tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology (for example, vacuum deposition through metal shadow-masks) that is difficult to scale to large substrates. Moreover, optical cavity devices typically suffer from an unacceptable angular color dependence. It is also known to employ a color filter with an optical cavity structure, for example, as taught in U.S. Pat. No. 7,189,238. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer. The material for the semi-transparent metallic electrode layer includes Ag, Au, or alloys thereof. The thickness of the semi-transparent metallic electrode layer, the combined thickness of the organic layers and the transparent conductive phase-layer, and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second OLED and defines an optical length of the second microcavity. The optical length of the second microcavity is such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change at different viewing angles, owing to the change in the effective optical path length for light traveling at angles to the normal.

US 2006/0066228 A1 entitled, "Reducing or eliminating color change for microcavity OLED devices", by Antoniadis discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs may have increased manufacturing costs due to patterned deposition processes. Also, significant light may be absorbed by the color filters thereby, reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled "Stacked OLED Display having Improved Efficiency" by Cok. However, the use of color filters substantially reduces the efficiency of the device. It is also known to employ a white sub-pixel that does not include a color filter, for example, as taught in U.S. Pat. No. 6,919,681 entitled "Color OLED Display with Improved Power Efficiency" by Cok et al. However, this disclosure does not address angular color issues or the large amount of trapped light.

U.S. Pat. No. 7,030,553 entitled "OLED device having microcavity gamut sub-pixels and a within gamut sub-pixel" by Winters et al, discloses an example of a prior-art microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode that can be difficult to manufacture in a top-emitting format. Moreover, angular color change is not addressed.

There still remains a need, therefore, for an improved light-emitting structure that overcomes shortcomings in the prior art and that increases the light output, angular color performance, and manufacturability of an LED device.

SUMMARY OF THE INVENTION

The need is met in one embodiment of the present invention with a white light-emitting microcavity light-emitting diode device that includes:

a) a substrate;

b) a reflective electrode and a semi-transparent electrode formed over the substrate and an unpatterned white-light-emitting layer formed between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements;

c) a plurality of color filters formed over a side of the semi-transparent electrodes opposite the unpatterned white light-emitting-layer in correspondence with the independently-controllable light-emitting elements to form colored sub-pixels, the plurality of color filters having at least two different colors and wherein at least one independently-controllable light-emitting element has at least two commonly-controlled portions that together emit substantially white light to form a white sub-pixel; and d) wherein the optical cavity of one or more of the commonly-controlled portions of the white sub-pixel comprises a plurality of optical microcavities, each optical microcavity tuned to emit light at a different complementary wavelength at an emission angle.

Another embodiment of the present invention provides the optical cavity of one or more of the commonly controlled portions of the white sub-pixel with optical microcavities. Each optical microcavity is tuned to emit light at a different complementary wavelength at multiple emission angles.

A third embodiment of the present invention provides a method of making an LED device, including the steps of:

a) providing a substrate;

b) forming a reflective electrode and a semi-transparent electrode over the substrate and forming an unpatterned white-light-emitting layer between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements;

c) forming a plurality of color filters over a side of the semi-transparent electrodes opposite the unpatterned white light-emitting-layer in correspondence with the independently-controllable light-emitting elements to form colored sub-pixels, the plurality of color filters having at least two different colors and wherein at least one independently-controllable light-emitting element has at least two commonly-controlled portions that together emit substantially white light to form a white sub-pixel; and d) wherein the optical cavity of one or more of the commonly-controlled portions of the white sub-pixel comprises a plurality of optical microcavities, each optical microcavity tuned to emit light at a different complementary wavelength at an emission angle.

ADVANTAGES

The present invention has the advantage that it increases the light output and manufacturability of an LED device, and reduces any angular color change.

BRIEF DESCRIPTION OF THE DRAWINGS

FIG. 10 is a flow diagram according to a method of the present invention; and

FIG. 11 is a system employing an LED device according to the present invention.

It will be understood that the figures are not to scale since the individual layers are too thin and the thickness differences of various layers too great to permit depiction to scale.

DETAILED DESCRIPTION OF THE INVENTION

Figure 1:
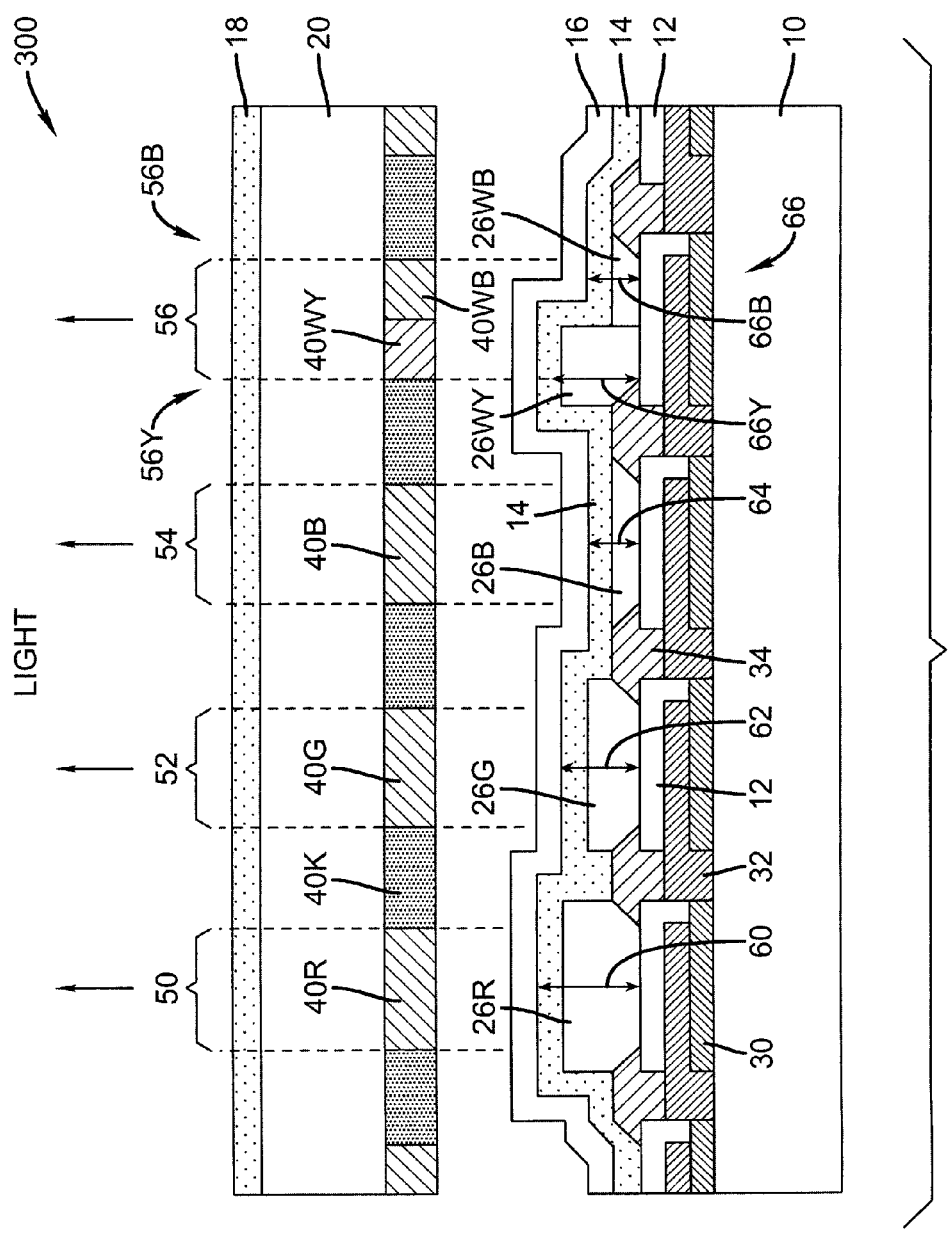
FIG. 1 illustrates a partial cross section of a top-emitter LED device according to an embodiment of the present invention.

Referring to FIG. 1, an exemplary embodiment of a light-emitting diode device according to the present invention comprises a substrate 10, a reflective electrode 12, and a semi-transparent electrode 16 formed over the substrate 10. Either the reflective electrodes 12 or semi-transparent electrodes 16 are patterned to form a plurality of independently-controllable light-emitting elements 50, 52, 54, and 56. As shown in FIG. 1, for example, reflective electrode 12 is patterned. The independently-controllable light-emitting elements may be controlled, for example by thin-film electronic components 30 formed on the substrate 10. The other electrode (e.g. 16) may be unpatterned and electrically common to all of the light-emitting elements 50, 52, 54, and 56. An unpatterned white-light-emitting layer 14 is formed between the reflective electrode 12 and the semi-transparent electrode 16 and may comprise a plurality of layers. The reflective electrode 12, semi-transparent electrode 16, and unpatterned white-light-emitting layer 14 form optical cavities 60, 62, 64, and 66. The optical cavity 66 further comprises a plurality of additional optical microcavities, for example 66Y and 66B, as described below. A plurality of color filters 40R, 40G, and 40B are formed over a side of the semi-transparent electrode 16 opposite the unpatterned white-light-emitting layer 14 in correspondence with the independently-controllable light-emitting elements 50, 52, 54 to form colored sub-pixels, the plurality of color filters having at least two different colors. At least one independently-controllable light-emitting element 56 has at least two commonly-controlled portions 56Y, 56B that together emit substantially white light to form a white sub-pixel. The optical cavity 66 of one or more of the commonly-controllable portions 56Y, 56B of the white sub-pixel comprises a plurality of optical microcavities 66Y, 66B, each optical microcavity tuned to emit light at a different complementary wavelength and emission angle. In a further embodiment of the present invention, the commonly-controllable optical microcavities 66Y, 66B, of the commonly-controllable portions 56Y, 56B of the white sub-pixel 56 emit complementary wavelengths of light at multiple angles, or even at all viewable angles.

As employed in the present invention, a pixel is a multi-color picture element comprising three or more sub-pixels, each sub-pixel includes an independently-controlled light emitter emitting light of a different color. Typically, pixels include red, green, and blue sub-pixels (an RGB configuration). In addition, as employed in this disclosure, a white sub-pixel is also included in each pixel (an RGBW configuration) and corresponds to the at least one independently-controllable light-emitting element sub-pixel. When a white sub-pixel is employed in an RGBW configuration, if the white sub-pixel has a greater luminous efficacy than any of the red, green, or blue sub-pixels (as will generally be true due to the lack of a color filter over the white sub-pixel) increased brightness or reduced power utilization is obtained for images containing regions having low-to-moderate color saturation (i.e. having a significant gray component). The light-emitting elements 50, 52, 54, 56 correspond to sub-pixels.

The present invention thus employs an RGBW (red, green, blue, and white) sub-pixel architecture to form individual pixels in an information presentation device, such as a display. A common, unpatterned white-light emitter 14 is employed. Colored light is formed by a combination of separately tuned microcavities for each color together with color filters 40R, 40G, 40B (for the color sub-pixels). A black matrix 40K can be employed to absorb ambient light between the light-emitting elements 50, 52, 54, 56. Planarizing and insulating layers 32 and 34 can be provided to electrically separate the independently-controllable light-emitting elements. A color filter may not be necessary for the commonly-controllable portions 56Y, 56B since the optical microcavities 66Y, 66B form complementary colors. However, in another embodiment of the present invention and as described below, one or more separate color filters 40WY, 40WB may also be employed together or separately with the commonly-controllable portions 56Y, 56B of the white sub-pixel 56.

According to some embodiments of the present invention, the common white emitter can be more efficient than at least one of the colored sub-pixels. Furthermore, one or both of a complementary pair of optical microcavities may have one or both light emitters being more efficient than at least one of the colored sub-pixels. The emission may be more efficient in comparison to the colored sub-pixels even if the colored sub-pixels did not include a color filter. The efficiency of the common white emitter is defined in terms of either radiant or luminous efficiency.

Figure 2:
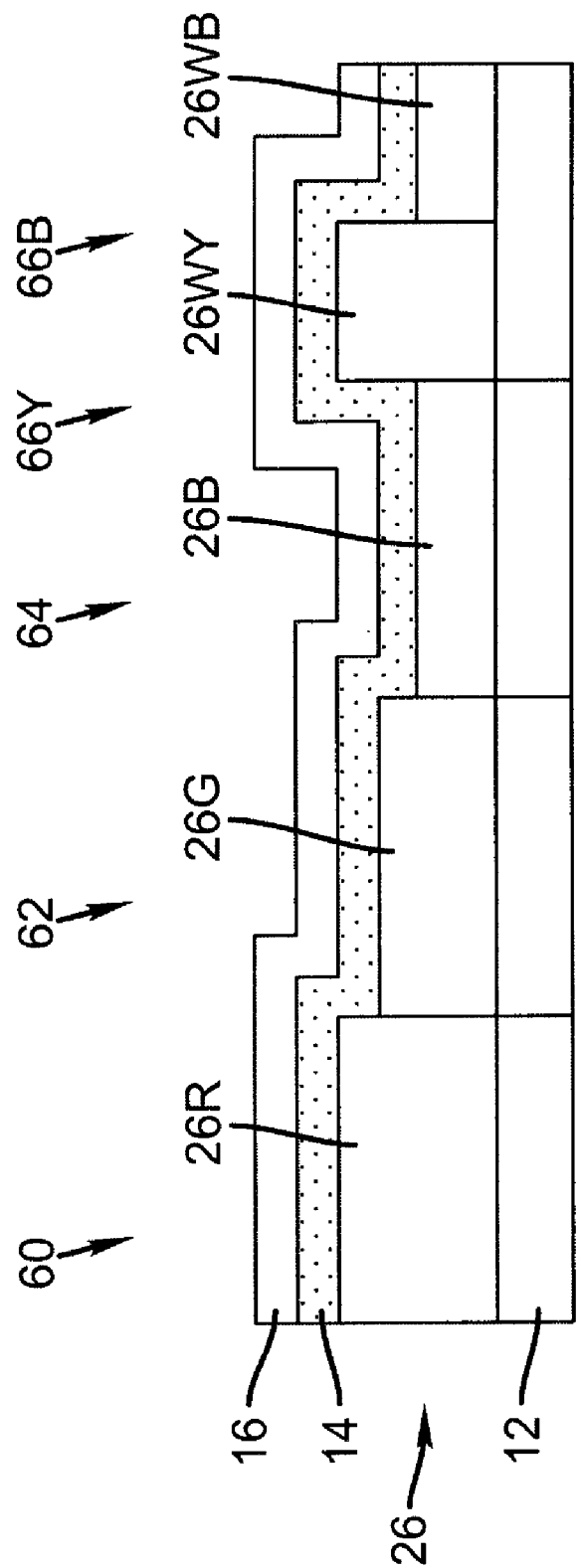
FIG. 2 illustrates a partial cross section of a top-emitter LED device shown in FIG. 1 according to another embodiment of the present invention.

Referring to FIG. 2, in a more detailed drawing of a portion of FIG. 1, a reflective electrode 12 is formed over a substrate (not shown) together with spacers 26 for optical cavities. Each of the optical cavities 60, 62, 64, 66Y, 66B is tuned with corresponding spacers 26R, 26G, 26B, 26WY, 26WB to form optical microcavities, e.g. red, green, blue, yellow, and blue respectively.

Figure 3:
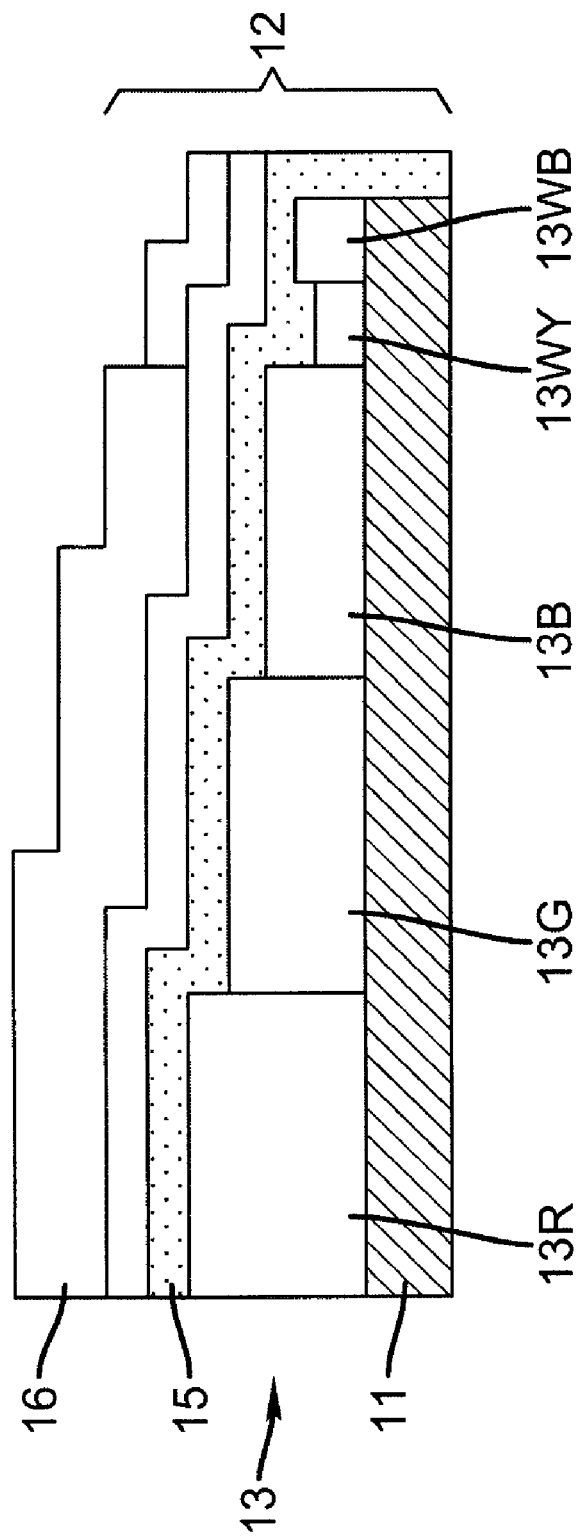
FIG. 3 illustrates optical spacers useful with various embodiments of the present invention.

As shown in FIG. 1, the present invention may employ spacer layers 26R, 26G, 26B, and 26W having different thicknesses between the reflective electrode 12 and the light-emissive layer 14. The different thicknesses are chosen to tune the optical response of the different optical cavities 60, 62, 64. In an alternative embodiment of the present invention, shown in FIG. 3, the optical cavities may be tuned by employing transparent spacer layers 13R, 13G, 13B, 13WY, 13WB between a reflective layer 11 and a transparent conductive layer 15, the reflective layer 11 and transparent conductive layer 15 comprising the reflective electrode 12. In other embodiments, (not shown) spacer layers may be located in other positions, for example, between the light-emissive layer 14 and the semi-transparent electrode 16. In all of these exemplary embodiments, a reflective layer and a conductive layer together comprise the reflective electrode, whether or not the reflective layer and the conductive layer are the same layer, adjacent layers, or are separated by spacer layers.

In this disclosure, complementary wavelengths of light are those wavelengths of light that, when viewed together, form a substantially white-appearing light such as light on or near the Planckian locus. For example, blue and yellow form a complementary pair, as do cyan and red and magenta and green. Red, green, and blue form a complementary triplet. Hence, the commonly-controllable optical microcavities 66Y, 66B of the commonly-controllable portions 56Y, 56B of the white sub-pixel 56, when viewed together, emit white light. According to various exemplary embodiments of the present invention, the sub-pixels may form pixels in a display wherein the sub-pixels are not individually distinguished by eye at a design viewing distance, nor are the commonly-controllable portions 56Y, 56B of the white sub-pixel 56. Hence, the light emitted from the white sub-pixel 56 will be viewed as white by a typical human eye, even though the light emitted from the white sub-pixel 56 is actually a combination of complementary colors. For simplicity, the drawings illustrate blue and yellow light-emitting optical microcavities 66Y, 66B but the present invention is not limited to that embodiment.

In operation, current, for example, as supplied through thin-film transistors 30, passes through the light-emitting layer 14 via the electrodes 12 and 16, causing light to be emitted. Some of the emitted light passes directly out of the device or through the color filters and out of the device. Other light is reflected from the reflective electrode 12 and passes out of the device. Other light, emitted at a higher angle to the normal, is trapped via total internal reflection. The optical cavity structures serve to reduce the angle of emission of the emitted light, thereby reducing the amount of trapped light and also focusing more of the desired light in the forward direction. Commonly-controllable portions 56Y and 56B of a white sub-pixel 56 are driven at the same time with the same electrical controls (e.g. transistors 30) so that they cannot be independently stimulated and, hence represent one sub-pixel, albeit having different optical components. The present invention may be employed with both active-matrix and passive-matrix control circuits.

In particular, the present invention provides a means to form a substantially white light that is viewed as white at a variety of angles from the normal. The light output from each optical microcavity 66Y, 66B increases in frequency (and decreases in wavelength) as the angle at which the light is emitted increases from the normal (90 degrees) with respect to the substrate. Within the prior art, it is understood that microcavities can be formed which vary in strength according to the reflectivity of the semi-transparent electrode. Devices having a strong microcavity will emit saturated (non-white) light. However, devices having a weaker microcavity may produce light that is relatively white when formed using an unpatterned white emitter. According to the prior art, when placed within a weak microcavity, a white emitter layer will produce a white light; however, such a single-element white emitter would tend to emit light that is shifted towards short wavelengths when viewed at angles greater than 0 degrees as measured to the normal of the reflective electrode 12. Since white emitters are inherently broadband, a general shift in a broad range of frequencies is seen at higher angles to the normal. In addition, the human visual system is most sensitive to green and, therefore, such a device will typically take on a green or cyan appearance when viewed at angles greater than 0 degrees from a normal to the reflective electrode.

However, according to one embodiment the present invention, stronger microcavities may be employed to form a white light-emitting element from two or more different optical microcavities, which individually may emit light that exhibits significant color saturation and has a narrower bandwidth than the white-light emitters alone. The different optical microcavities of the white sub-pixel 56 can mutually compensate for the shift in the output frequency that occurs in each of the individual microcavities when they are viewed at an angle greater than 0 degrees. More precisely, the wavelength or efficiency of the light emitted from each of the commonly-controlled portions 56Y, 56B of the white sub-pixel 56 will change at different viewing angles, but in a complementary fashion such that the white-point of the combined light emission from the commonly-controlled portions 56Y, 56B will undergo a relatively small change as compared to the color change of the individual commonly-controlled portions 56Y, 56B.

Figure 4:
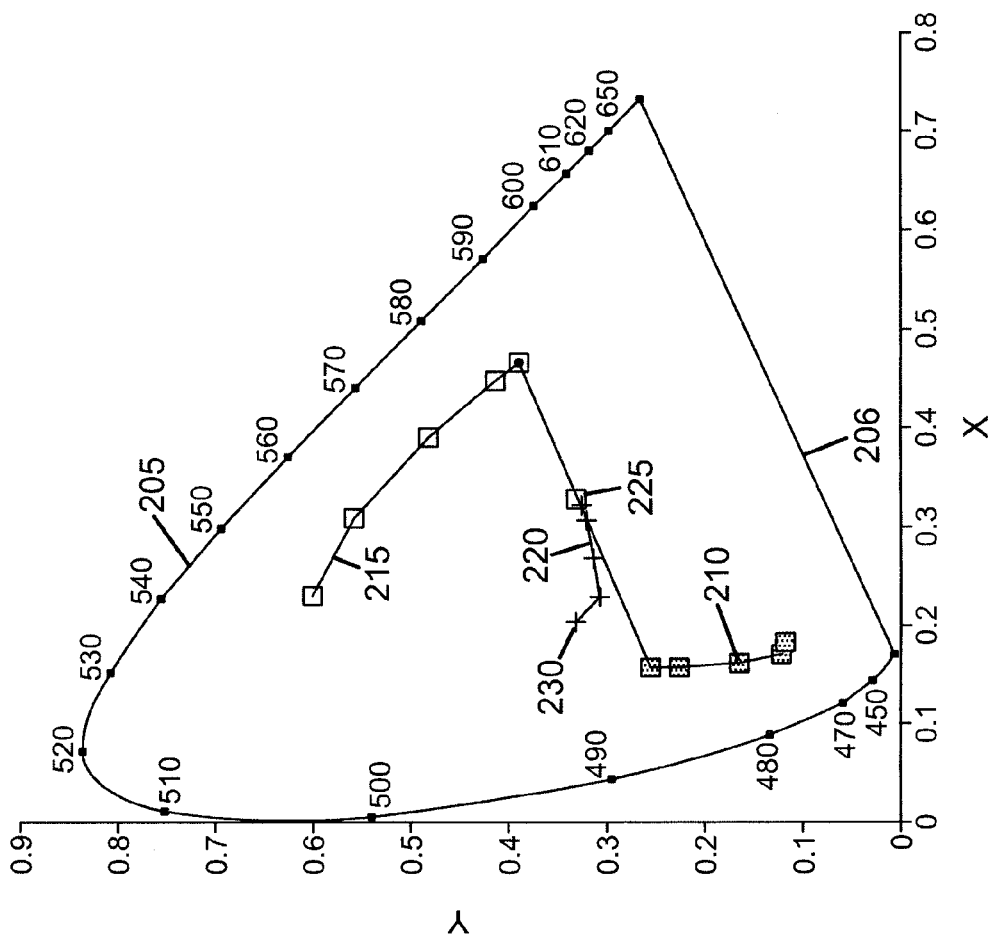
FIG. 4 is a graph illustrating the light emission wavelengths in CIE x and CIE y space of various embodiments of the present invention.

Referring to FIG. 4, a CIE 1931 x,y chromaticity diagram is shown with a spectrum locus 205 illustrating the position of monochromatic light sources, and a combining red and blue light boundary 206. The area enclosed by the spectrum locus 205 and the purple boundary 206 includes all visible colors. The light emission 210 of a cyan/blue-emitting optical microcavity (e.g. from optical microcavity 66B) is shown at a plurality of increasing angles with respect to the substrate's normal, beginning at the normal with x,y coordinates of 0.160, 0.253 and ending at 60 degrees with x,y coordinates of 0.186, 0.116. In particular, note that as the viewing angle of the optical microcavity increases, the perceived color of the light becomes bluer, with a higher frequency and shorter wavelength. Likewise, the CIE coordinates 215 of a yellow/green-emitting optical microcavity (e.g. from optical microcavity 66Y) is shown at a plurality of angles. Again, as the viewing angle of the optical microcavity increases, the perceived color of the light becomes greener, with a higher frequency and shorter wavelength, beginning at x,y coordinates of 0.469, 0.389 and ending at x,y coordinates of 0.233, 0.598. Although the light emitted from the individual commonly-controllable portions is colored, since the colors are complementary the combined light appears to be white, having CIE 1931 chromaticity coordinates of 0.267, 0.300 when viewed at 0 degrees viewing angle and 0.1987, 0.246 when viewed at an angle of 60 degrees, shown as CIE coordinates 220. As the angle of view changes, both the blue and yellow emitters change color significantly. However, the combined color stays relatively constant and substantially white. Point 225 illustrates the white point at a normal angle relative to the substrate and point 230 illustrates the white point at a 60-degree angle relative to the substrate normal. These curves are taken from a real, white-light OLED device made by applicants with the change in color at different angles modeled.

Figure 5:
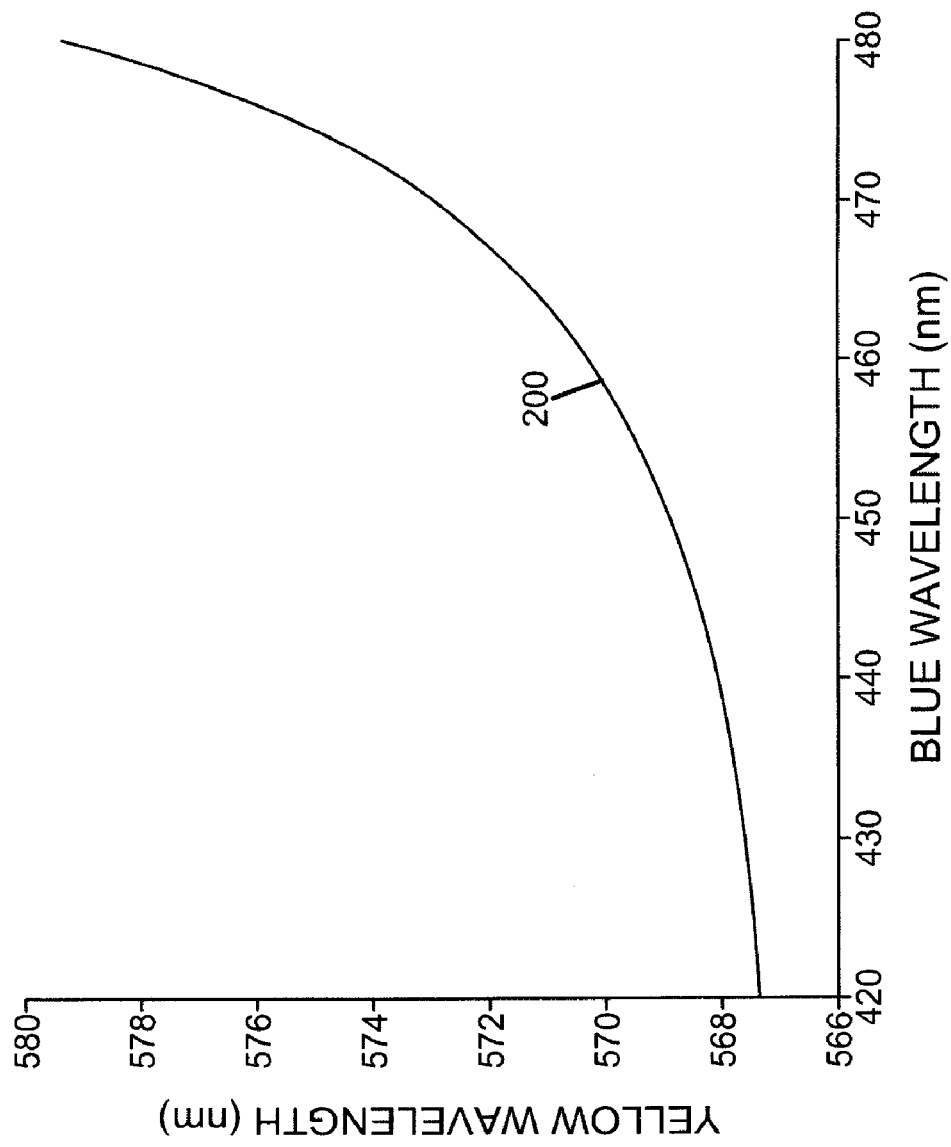
FIG. 5 is a graph illustrating the constant D65 light output for various yellow and blue frequency combinations useful in understanding various embodiments of the present invention.

As can be seen from this graph, the chromaticity coordinates of the white change little in the y dimension, while a somewhat larger change is seen in the x dimension. However, the overall change is smaller than that of either of the blue or yellow emitters and the color remains substantially white. Referring to FIG. 5, a graph of a constant D65 white point 200 is shown at different, complementary yellow and blue emission frequencies. As can be seen from this graph, a greater change in the yellow wavelength is required to offset a smaller change in the blue wavelength to maintain the white point. Further, experiments conducted by the applicants have shown that observers are more tolerant of color shifts in white or neutrals towards the blue direction than towards the yellow direction. The emitters shown in FIG. 4 take advantage of these effects by balancing the blue-yellow contributions to minimize the yellow shift while permitting some deviation in the blue direction. This change can be physically controlled by employing a color filter formed over one of the commonly-controlled portions 56Y, 56B that preferentially transmits light emitted at a normal angle with respect to the substrate and preferentially absorbs light emitted at an angle other than the normal. For example, a filter (40WY in FIG. 1) may be employed over the yellow-light-emitting optical microcavity 66Y. The color filter absorbs greenish light having a wavelength less than, for example, 570 nm, 560 nm, or 550 nm. This will have the effect of limiting the movement of the white point to shorter wavelengths or, equivalently, increasing the relative impact of the blue emitters. In alternative embodiments and as modeled by the applicants, a filter (e.g. 40WB in FIG. 1) that absorbs bluish light having a wavelength less than, for example, 500 nm, 490 nm, or 480 nm may be employed.

A large variety of white-light-emitting materials may be employed in concert with the present invention, together with a wide selection of optical cavity sizes, both for the colored sub-pixels 50, 52, 54, and the optical microcavities 66B, 66Y of the white sub-pixel 56. In one embodiment of the present invention, one of the commonly-controlled portions 56Y, 56B of the white sub-pixel 56 may emit substantially blue or cyan light at a normal angle with respect to the substrate and another of the commonly-controlled portions may emit substantially yellow, orange, or red light at a normal angle with respect to the substrate. One of the commonly-controlled portions of the white sub-pixel 56 may emit light having a peak wavelength emission greater than 550 nm at a normal angle with respect to the substrate and another of the at-least-two commonly-controlled portions of the white sub-pixel emits light having a peak wavelength emission less than 500 nm at a normal angle with respect to the substrate. In other embodiments, the optical micro-cavities of the white sub-pixel are tuned to emit red, green, and blue light, or yellow and blue light, or red and cyan light, or orange and cyan light or magenta and green light. In particular, one of the commonly-controlled portions of the white sub-pixel may be tuned to emit light having a peak wavelength greater than 550 nm at a normal angle and may include a color filter formed over the commonly-controlled portion of the white sub-pixel, the color filter absorbing a substantial amount of the light having a wavelength less than 550 nm.

Figure 6A:
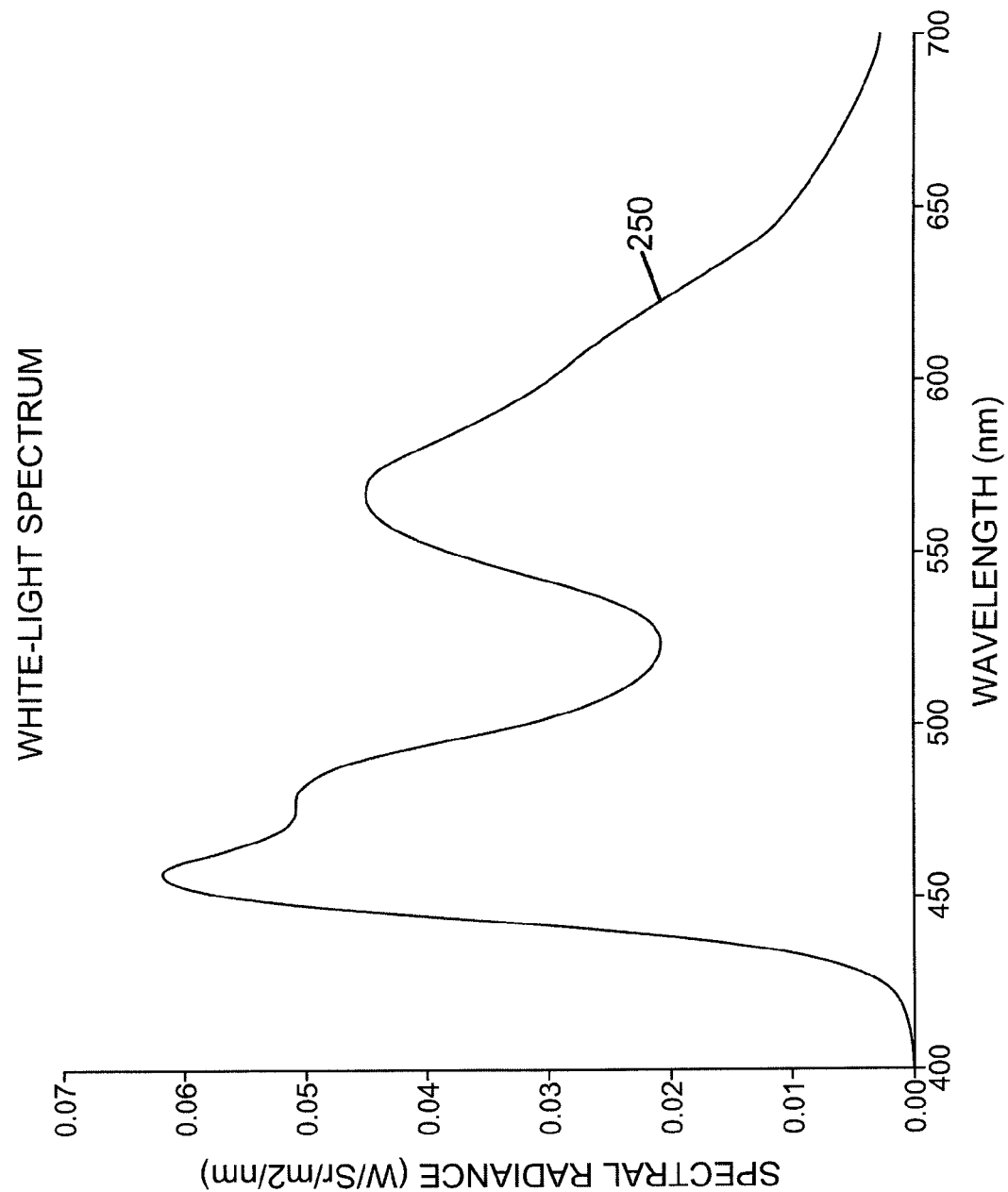
FIG. 6A is a graph illustrating the spectrum of a white emitter at a normal viewing angle without a microcavity structure useful in various embodiments of the present invention.
Figure 6B:
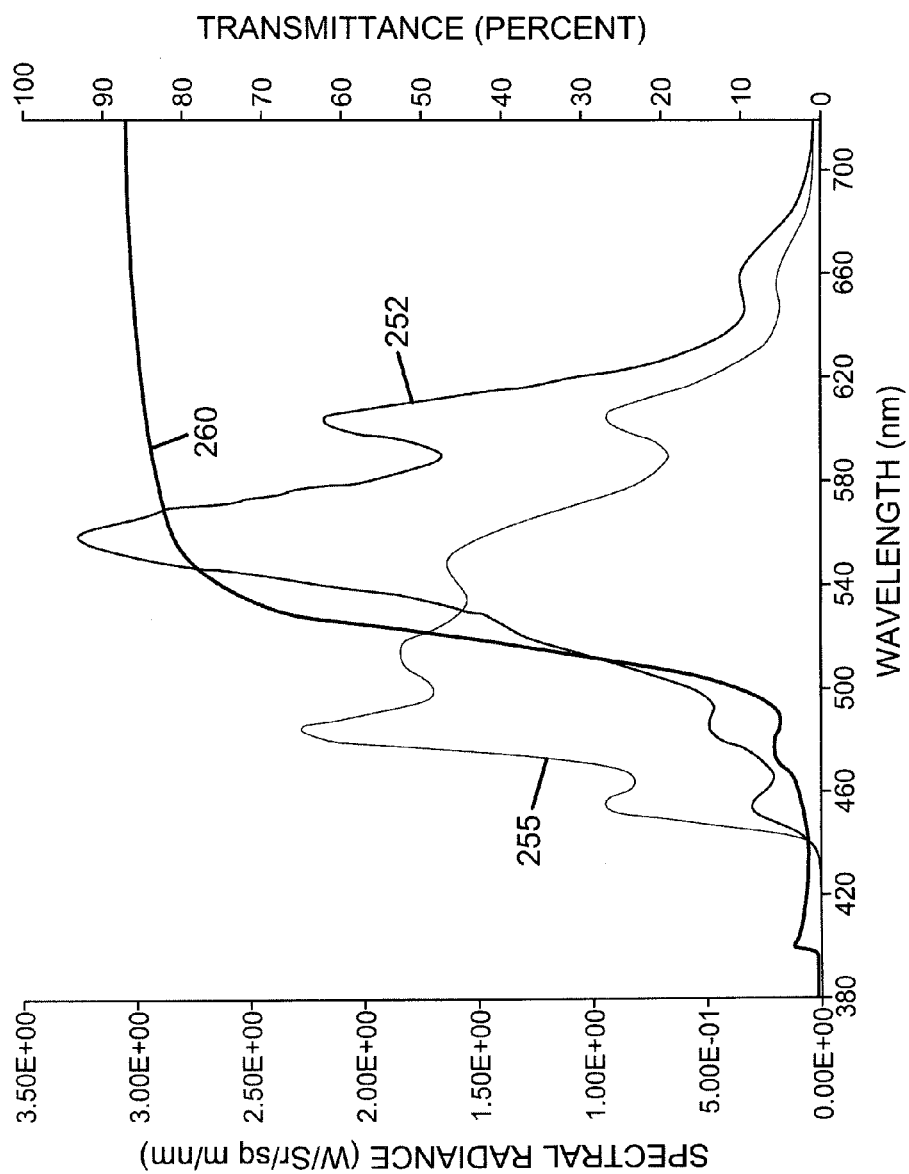
FIG. 6B is a graph illustrating the spectrum of a white emitter with a microcavity at a normal viewing angle and at a different viewing angle together with the spectrum of a color filter useful in various embodiments of the present invention.
Figure 6C:
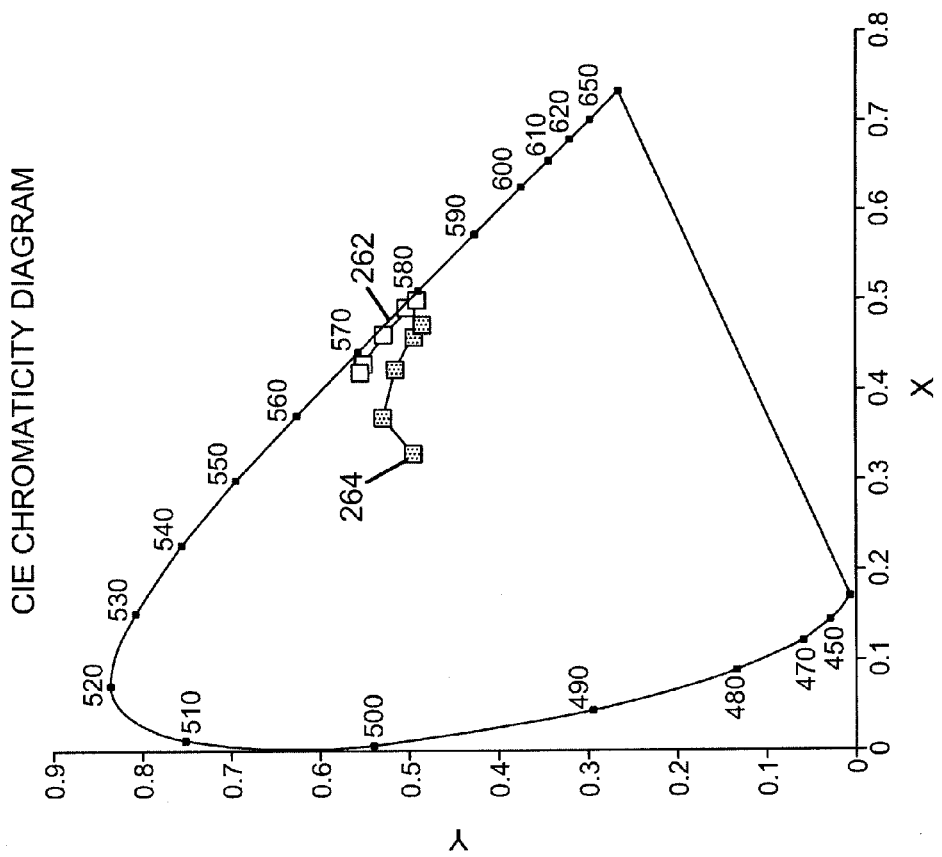
FIG. 6C is a graph illustrating the light emission wavelength wavelengths in CIE x and CIE y space of an embodiment of the present invention that incorporates a color filter.

A variety of white-light emitters may be employed with the present invention and a variety of microcavities may be formed to create white light-emitting elements from these white-light emitters. For example, FIG. 6A is a graph of the spectrum 250 of a white-light emitter, made by applicants, and useful for the present invention. Referring to FIG. 6B, spectrum 252 is the light output from one microcavity useful as the yellow commonly-controlled portion of the white sub-pixel. As the viewing angle increases, the emission frequency increases, shown by a shifted spectrum 255. By employing a color filter with a high-pass spectrum 260 formed over one of the commonly-controlled portions (e.g. 56Y), light may be preferentially transmitted through the color filter at a normal angle, with respect to the substrate, and preferentially absorbed by the color filter at an angle other than the normal. Hence, the color shift with viewing angle may be reduced without reducing the amount of light emitted at a normal angle. Referring to FIG. 6C, the color shift with angle 264 for a white emitter in a microcavity, turned for yellow emission without a color filter, is longer than the color shift with angle 262 for a white emitter in a microcavity tuned for yellow emission with a color filter. The color filters (including those of the colored sub-pixels) will, however, reduce the luminance of the device at angles away from the normal. It should be noted, however, that the relative luminance efficiency of each portion as well as the chromaticity coordinate of each of the commonly controlled portions of the white sub-pixel will change as a function of viewing angle. In some such devices, using a yellow filter to reduce the luminance of the yellow commonly controlled portion as a function of viewing angle can be useful in maintaining a relatively constant luminance, because the luminance efficiency of the human eye increases as the peak in the yellow moves towards 550 nm.

Figure 7:
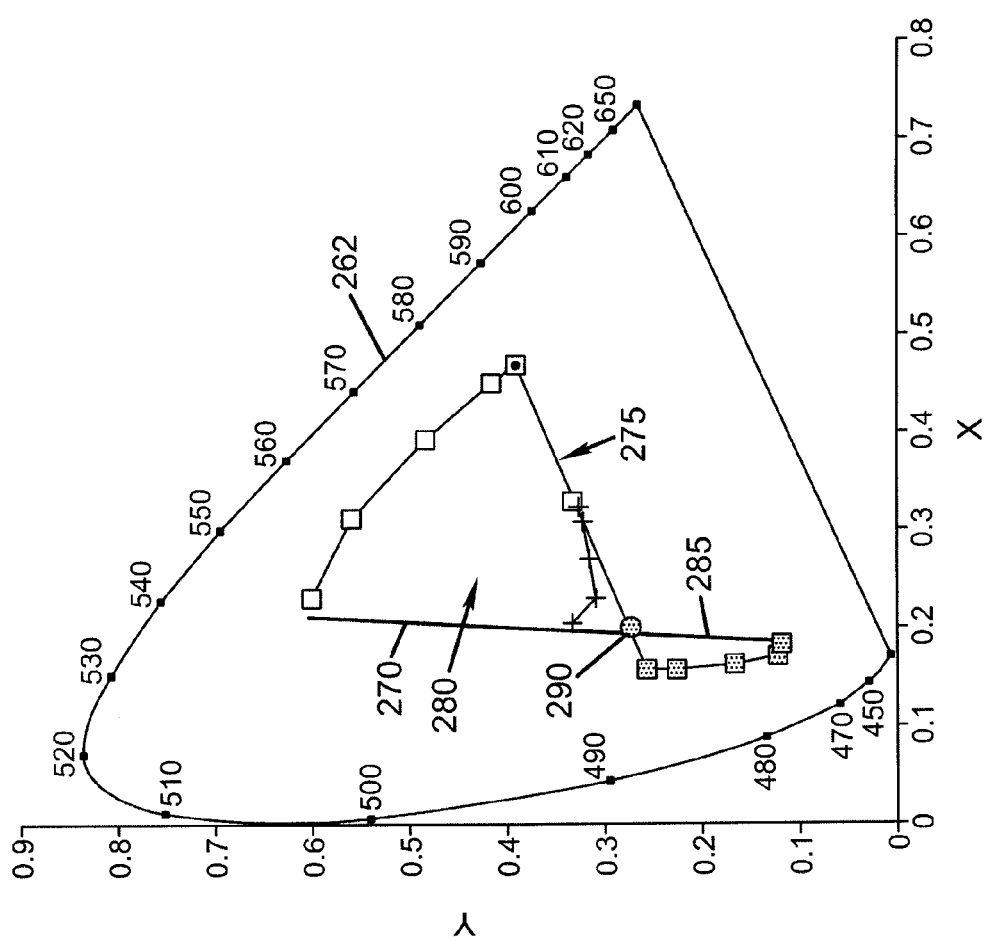
FIG. 7 is a graph illustrating various portions of FIG. 6C.
Figure 8:
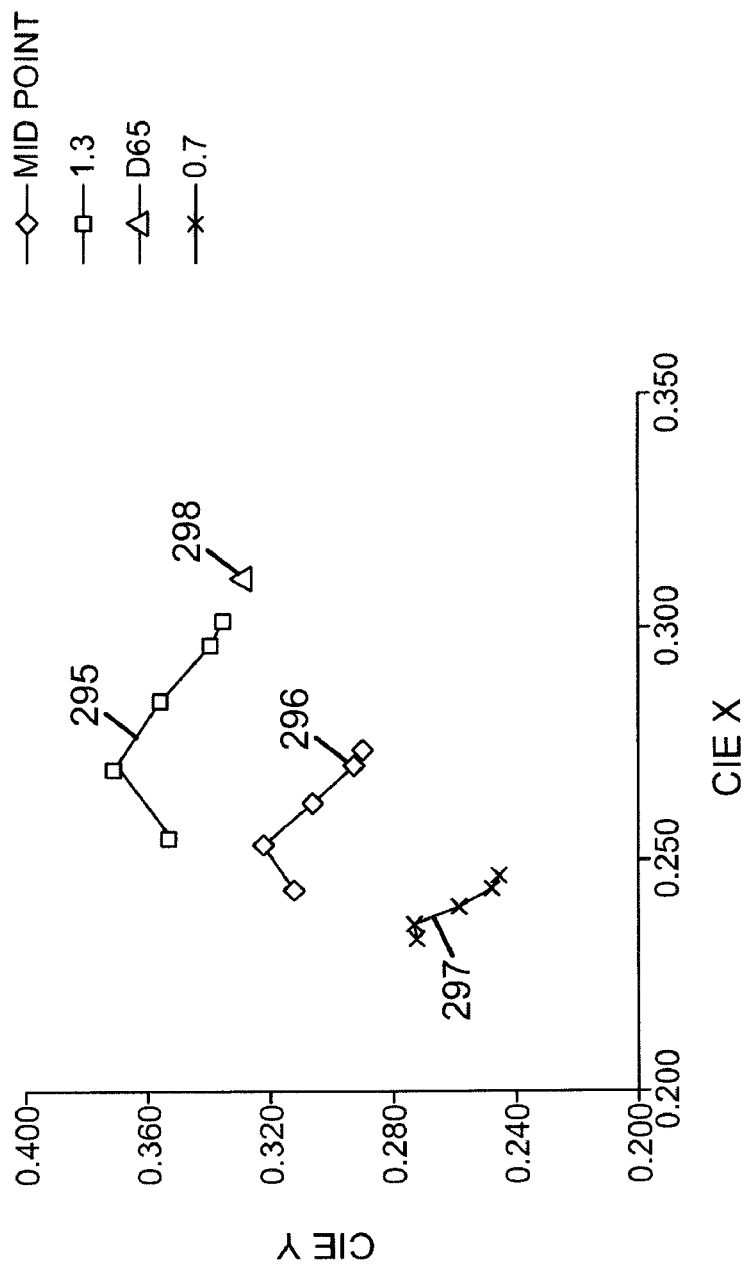
FIG. 8 is a graph illustrating the white point variation with viewing angle for a white sub-pixel with different relative sizes of the commonly-controllable portions according to various embodiments of the present invention.
Figure 9:
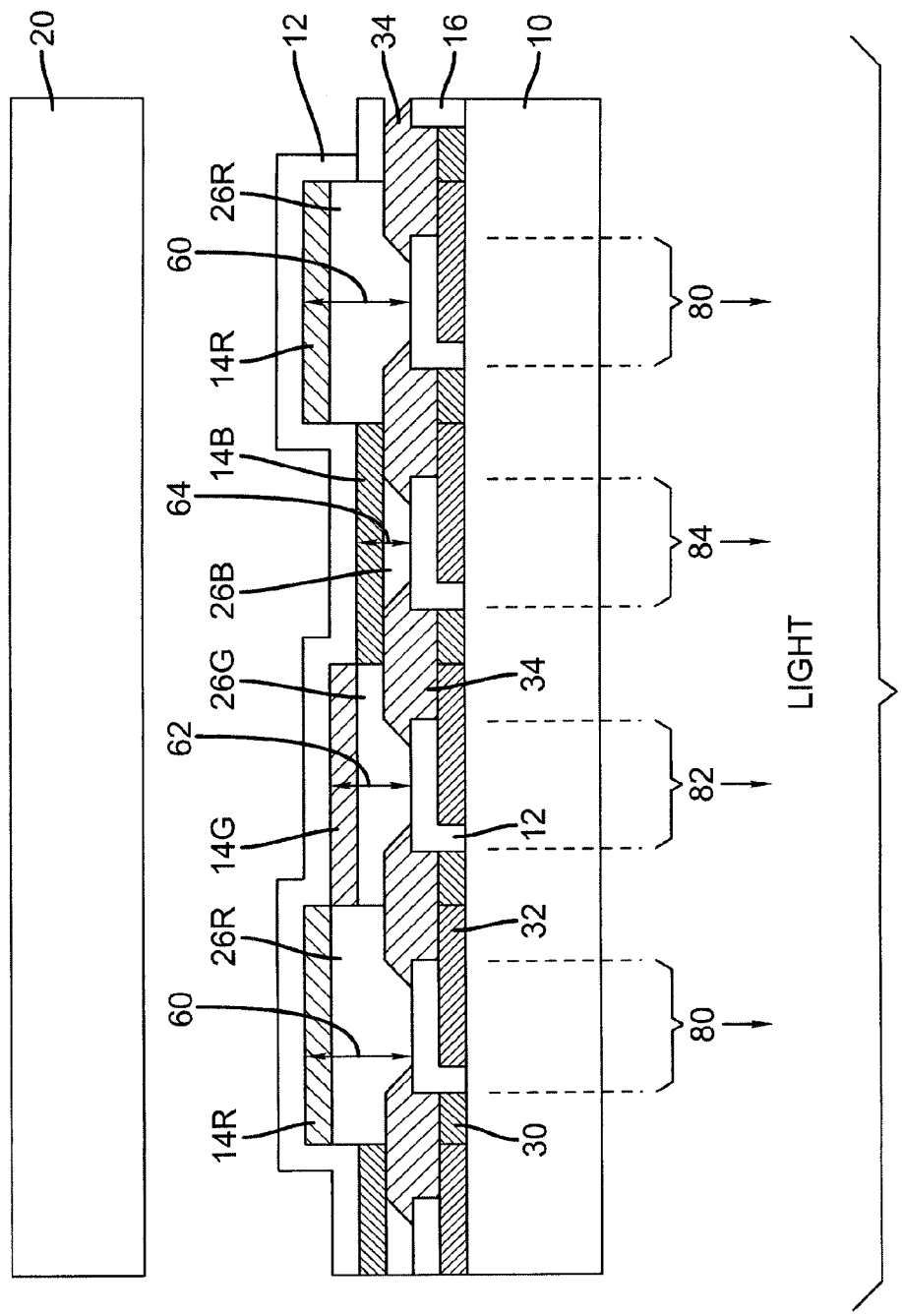
FIG. 9 illustrates a partial cross section of a prior-art bottom-emitter LED device.

The light emission from devices of the present invention may be further controlled by employing differently-sized areas for each of the commonly-controlled portions 56Y, 56B of the white sub-pixel 56. As shown in FIG. 7, boundary lines 270 and 275 connecting the CIE x and y coordinates of the blue and yellow emitters at the minimum and maximum angles of interest form areas 280 and 285 with a common intersection point at point 290. By changing the relative sizes of the areas of the commonly-controlled portions 56Y, 56B, the relative positions of the white points may be moved closer to, or farther from, the intersection point 290. Hence, the amount of change in white point can be reduced as the white points move closer to the intersection point 290. Likewise, the amount of white-point change can be increased as the white points move further from the intersection point 290. Since, in typical organic light-emitting diode systems (OLEDs), yellow emitters are more efficient than blue, it can be advantageous to move the emitters toward the yellow emission points, even if the white points vary more, as long as the white-point variation is acceptable. Referring to FIG. 8, three curves are shown in a CIE x and y graph representing the white point variation from minimum viewing angle to maximum viewing angle for a white-light emitter (a different white-light from that of FIG. 7). The relative sizes of the areas of the yellow 56Y vs. blue 56B commonly-controllable portions are equal for curve 296), 1.3 for curve 295, and 0.7 for curve 297. A D65 white point is shown as point 298. The relative light emission and color shift shown in curve 295 is relatively greater than those of curves 296 or 297.

The light emission from the optical cavities of the present invention may be increased by matching the spectrum of the emissive material, the color filter peak transmissions, and the optical microcavity response. That is, the optical cavities of the colored sub-pixels may be tuned to an approximate peak wavelength corresponding to the peak transmission wavelength of the corresponding color filter by changing the optical path length of the cavity. Likewise, the optical microcavities of the white sub-pixels may be tuned to one or more peak wavelengths approximately corresponding to the peak emission wavelengths of the white-light-emitting layer. Similarly, the peak emission wavelengths of the white-light-emitting layer may be matched to the peak transmission wavelength of the corresponding color filter.

However, an overall optimization of the system may require that not all of the light-emitting layer peak emission, peak color filter transmission, and optical cavity peak match. It is also possible that at least one of the commonly-controlled portions 56Y, 56B of the white sub-pixel 56 is tuned to emit light at a peak wavelength different from the peak wavelengths of the colored sub-pixels 50, 52, 54. While the number of manufacturing steps may be reduced if two or more optical cavity sizes are identical (for example, a cavity 64 for a blue-colored sub-pixel and a cavity 66B for a blue-emitting portion 56B of a white sub-pixel 56), it is also possible that an overall system may be optimized if the optical cavities have different lengths, for example the white sub-pixel may have a portion cavity tuned to emit a more cyan-colored light than the cavity of a blue-colored sub-pixel.

It may also be possible to design a system in which the normal emission of the white sub-pixel is at a specific white point, such as D65. However, it is possible that the color change with viewing angle or average emission from a desired white point of such a design may be greater than an alternative design in which the emission stays closer to a desired white point or has a reduced change in white point with changing viewing angle, but never actually emits light at the desired white point. Such a design, in which the average performance is superior, may be desired. By average emission is meant the average white point for all of the viewing angles of interest, either weighted or unweighted by importance in an application. Hence, a preferred design may tune the emissions of the white sub-pixel to minimize the difference between the average emission of the white sub-pixel and a preferred device white-point at more than one angle, rather than to match a desired white point at a single viewing angle.

A variety of light-emissive materials may be employed in the present invention. For example, the white-light-emitting layer may comprise organic materials such as small-molecule organic or polymer materials or inorganic quantum dots formed in a poly-crystalline semiconductor matrix. Conventional photolithographic techniques may be employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide. Organic materials may be deposited by various means known in the art, for example, vacuum evaporation. However, such means must provide sufficient precision and accuracy to enable the consistent manufacturing of the optical cavities. In particular, the Kodak Vapor Injection System™ is a linear, organic vacuum evaporation source providing deposition of organic layers to within 1% uniformity and accuracy that may be usefully employed. Suitable semi-transparent cathodes may be formed by evaporation or sputter techniques known in the art, for example of silver, magnesium, aluminum or other metals or metal alloys. These semi-transparent electrodes will typically have a reflectance of greater than 20% and will ideally have an absorbance of less than 10%. Encapsulation techniques for both organic and inorganic materials useful for the present invention are known in the art. The present invention may be employed with various elements, such as circular polarizers (18 in FIG. 1), suitable for improving device ambient contrast ratio. In one embodiment, the present invention is a top-emitter device, as shown in FIG. 1. In an alternative embodiment, (not shown) the device is a bottom-emitter device.

Referring to FIG. 10, according to the present invention, a method of making an LED device comprises the steps of: 400 providing a substrate; 410 forming a reflective electrode and 420 forming an unpatterned white-light-emitting layer over the reflective electrode. A semi-transparent electrode may be formed 430 over the reflective electrode so that the unpatterned white-light-emitting layer is formed between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements, 440 forming a plurality of color filters over a side of the semi-transparent electrodes, opposite the unpatterned white light-emitting-layer, in correspondence with the independently-controllable light-emitting elements to form colored sub-pixels. The color filters can be at least two different colors. At least one independently-controllable light-emitting element has at least two commonly-controlled portions that together emit substantially white light to form a white sub-pixel, and wherein the optical cavity of one or more of the commonly controlled portions of the white sub-pixel comprises a plurality of optical microcavities, each optical microcavity tuned to emit light at a different complementary wavelength at an emission angle or multiple emission angles. In an alternative embodiment of the present invention, the unpatterned white-light-emitting layer is formed over the semi-transparent electrode.

Through consumer research and optimization of white-light emitters, and with carefully selected optical cavity choices, applicants have demonstrated that the color change in white-light emitters using optical microcavities of the present invention are acceptable to consumers. Such microcavity structures have advantages, particularly in top emitter configurations, since a semi-transparent electrode (for example comprising a thin layer of silver) is much more electrically conductive than a fully transparent electrode (for example comprising a transparent conductive oxide such as indium tin oxide). The present invention provides improved light output from the microcavity structure, reduced angular color shift, and reduced costs from employing an unpatterned light-emitting layer, either organic or inorganic.

Referring to FIG. 11, the present invention may be employed in an information-display system having an LED display device 300 (shown in greater detail in FIG. 1) and a controller 310 for receiving information signals 320 (e.g. text, and images) and driving the display 300 to display the information signal 320.

In a patterned device, different materials may be employed to emit light of different colors in response to a current. In contrast, in an unpatterned device, the same materials are employed to emit a single color, for example, white, and the light emitted by the color sub-pixels is colored by employing color filters in combination with the white-light emitter. Often, a white-light emitter will include a combination of materials in one or more unpatterned layers that each emit a different color, for example, blue and yellow or red and cyan, to emit a light that is perceived, overall, to be white. The important point is that however many light-emitting materials are included in a single layer, or however many layers are included, the layers are unpatterned and their aggregate emission employed in all of the sub-pixels in all of the pixels.

It is known in the prior art that, in LED devices, light may be trapped by total internal reflection in the high-optical-index layers that actually emit light, or high-optical index charge-control layers, or high-optical index transparent electrodes. Light emitted at low angles to the normal may be emitted from the device, while light emitted at a relatively higher angle to the normal may be trapped in the high-optical-index layers. By employing an optical cavity structure, the emission of light at high angles is reduced so that more light is emitted from the device at relatively lower angles to the normal.

It is also true that the color of light emitted from optical cavity structures has a dependence on the viewing angle. This angular dependence can be extremely irritating to viewers, in particular for applications in which a large viewing angle is valued. This color shift with angle is especially noticeable for color sub-pixels using a white-light emitter. However, the color filters employed in the present invention for the color sub-pixels not only absorb ambient light, they also reduce the observed dependence on angle of the light color found with an optical cavity device.

However, the color shift reduction found with increasing angle for the color sub-pixels provided by the present invention does reduce the luminance of these color sub-pixels. Such a reduction in luminance is less noticeable and objectionable to viewers than a shift in color. Moreover, to the extent that the color sub-pixels decrease in luminance, while the luminance of the white sub-pixels is constant (although a white-point shift may occur) as a result of changing viewing angle, the net effect may be a reduction in overall color saturation. Such a color saturation reduction may be negligible for some images (i.e. those images with little saturated color) and less noticeable than a change in color for those images with strongly saturated colors. Hence, improved image quality may be obtained. Moreover, since most images are relatively unsaturated, the net luminance effect may often be relatively minor.

Applicants have physically constructed numerous OLED devices employing microcavities, both with patterned, colored emitters and with white emitters and have studied their performance together with the performance of circular polarizers and color filters. Moreover, optical modeling tools have been employed to understand the performance of the present invention under a variety of circumstances. In general, a white-light-emitting, unpatterned OLED device employing an optical cavity and color filters can be expected to roughly double the light output of the colored pixels in comparison to a white-light-emitting, unpatterned OLED device without an optical cavity and color filters. The color sub-pixels will increase in light output the most, while the white-light-emitting sub-pixel will only change in light output by a multiplicative factor of roughly 0.6 to 1.2, since it is more difficult to increase broadband light output than narrow-band light in an optical cavity structure. However, since the white-light-emitting sub-pixel is more efficient (by about a factor of three) than the color sub-pixels (since no color filters are employed in the white sub-pixel), the use of a white sub-pixel improves the overall performance of an OLED device as most images have few saturated colors and the more-efficient white-light emitter is used disproportionately. Applicants have demonstrated that the use of such a white sub-pixel in a color filter design can improve the overall device performance by a factor of approximately two for some imaging applications.

An explicit optical modeling calculation of a device employing a two-peak OLED emitter (such as that shown in FIG. 6) was performed with a reflective aluminum back electrode 12 and a thin, silver semi-transparent electrode 16. With a commercially-available color filter set, the red light output on-axis increased by 2.8 times, the green light output is increased by 2.0 times, and the blue light output is increased by 1.75 times and improved color gamut is obtained. With a proprietary color filter set developed by applicants that allows for improved color gamut at the cost of somewhat decreased efficiency, the factor by which the on-axis light output is increased when the optical cavity structure of the present invention is employed is further increased by 5-15% for the red, blue, and green sub-pixels. Again, improved color gamut is also improved due to the optical cavity.

By employing an Ag reflective back electrode, the device performance is expected to improve further by 5-20%. Thus, if the proprietary color filters are employed together with the Ag reflective back electrode, the red light output may increase by approximately 3.5 times, the green light output may increase by approximately 2.4 times, and the blue light output may increase by approximately 2.1 times, while the white light output may increase by approximately 0.7 to 1.6 times, depending on the configuration.

Applicants have measured the performance of various attributes of the present invention and modeled the integrated performance of such devices. The performance of various embodiments of the present invention compared to the prior art is summarized in the table below. In this table, the "relative radiance" describes the amount of light emitted on-axis (and is estimated by taking an equally-weighted average of the gain factor for the red, green, blue, and white sub-pixels), the "RGB color" refers to the purity of the color sub-pixels, the "white color" refers to the accuracy of the white (i.e. how close the white light is to a standard white point such as D65), the "reflectance" is a measure of the ambient light reflected from the device, and the "angular color white" refers to the change in color of the white-light emission when viewed at angles other than the normal angle. "WRGBW" refers to an unpatterned white-light-emitting LED material with red, green, and blue color sub-pixels, and a white-light sub-pixel as shown, for example, in U.S. Pat. No. 6,897,876, "WRGB" refers to an unpatterned white-light-emitting LED material with red, green, and blue color sub-pixels only. Sub-pixels are all assumed to be the same size, used equally, and the comparison is made to the prior-art configuration with a relative radiance of 1.0 using the best estimate above. A circular polarizer is used having a single-pass transmission of 44% and allowing 1.6% of ambient light that is incident on a device with an ideal rear reflector to be reflected from the device. The proprietary filters referenced above are used for the color filters. No black matrix is employed, but if present, would further decrease the quantity of reflected light.

| Structure | Relative Radiance | RGB Color | White Color | Overall Reflectance | Angular Color White |
|---|---|---|---|---|---|
| WRGBW - No optical cavity No Circular Polarizer (prior art) | 1.0 | Good | Excellent | 34% | Moderate |
| WRGBW - No optical cavity with Circular Polarizer (prior art) | 0.44 | Good | Excellent | 0.5% | Moderate |
| WRGB - optical cavity With Circular Polarizer | 0.44 | Excellent | | 0.06% | Poor |
| WRGBW - optical cavity Circular Polarizer, White optical cavity sub elements (Present invention) | ~1.0 | Excellent | Excellent | 0.25% | Moderate |

As can be seen from the table, the present invention provides an excellent combination of useful features. In the absence of the circular polarizer, the light output will increase from a factor of approximately 1.0 to a factor of approximately 2.27 with a consequent increase in reflectivity, although the circular polarizer, if employed absorbs an approximately equivalent amount of light, as shown in the table. The present invention differs importantly from the prior art in that 1) microcavities with a narrowband spectral response are employed in the formation of all sub-pixels, especially including the white and 2) a white point is not only formed from narrowband microcavity emitters, but is maintained over multiple viewing angles by carefully balancing the response of these emitters over the multiple viewing angles in a way that is acceptable and pleasing to the observer.

Applicants have also modeled the expected change in color due to emission angle for the white sub-pixel of the present invention. In this model, the plurality of optical microcavities for the white sub-pixel is varied in cavity length up to 160 nm. The shift in color due to angle of emission for the white sub-pixel is then reduced to the shift seen in non-optical-microcavity devices, or less, while increasing light output.

Further details with regard to the use of circular polarizers and color filters are disclosed in commonly-assigned, and are hereby incorporated by reference in their entirety.

LED devices of this invention can employ various well-known optical effects in order to enhance their properties, if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings may be specifically provided over or as part of the cover or substrate.

The present invention may be practiced with either active- or passive-matrix OLED devices, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 11 | reflective layer |
| 12 | reflective electrode |
| 13, 13R, 13G, 13B, 13WY, 13WB | spacer |
| 14 | light-emitting layer(s) |
| 14R, 14G, 14B | patterned light-emitting layers |
| 15 | transparent conductive layer |
| 16 | semi-transparent electrode |
| 18 | circular polarizer |
| 20 | cover |
| 26 | spacers |
| 26R, 26G, 26B, 26WY, 26WB | spacer |
| 30 | thin-film circuitry |
| 32 | insulator |
| 34 | insulator |
| 40 | color filters |
| 40R, 40G, 40B, 40WY, 40WG | color filter |
| 40K | black matrix |
| 50, 52, 54, 56 | light-emitting elements, sub-pixels |
| 56Y, 56B | commonly-controllable portions |
| 60, 62, 64, 66, 66B, 66Y | optical cavity |
| 80, 82, 84 | light |
| 200 | D65 white point |

| PARTS LIST -continued | |
|---|---|
| 205 | spectrum locus |
| 206 | purple boundary |
| 210 | CIE coordinates of blue emission curve |
| 215 | CIE coordinates of yellow emission curve |
| 220 | white point curve |
| 225 | white point at normal viewing angle |
| 230 | white point at maximum viewing angle |
| 250 | white emission spectrum |
| 252 | white microcavity emission spectrum |
| 255 | shifted white microcavity emission spectrum |
| 260 | color filter transmission spectrum |
| 262 | color shift with angle |
| 264 | color shift with angle |
| 270 | boundary line |
| 275 | boundary line |
| 280 | region |
| 285 | region |
| 290 | intersection |
| 295 | emission curve |
| 296 | emission curve |
| 297 | emission curve |
| 298 | D65 white point |
| 300 | device |
| 310 | controller |
| 320 | signal |
| 400 | process step: provide substrate |
| 410 | process step: form electrode |
| 420 | process step: form unpatterned white-light-emitting layer |
| 430 | process step: form semi-transparent electrode |
| 440 | process step: form color filters |

The invention claimed:

1. A white light-emitting microcavity light-emitting diode device, comprising:
   a) a substrate;
   b) a reflective electrode and a semi-transparent electrode formed over the substrate and an unpatterned white-light-emitting layer formed between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements;
   c) a plurality of color filters formed over a side of the semi-transparent electrodes opposite the unpatterned white light-emitting-layer in correspondence with the independently-controllable light-emitting elements to form colored sub-pixels, the plurality of color filters having at least two different colors and wherein at least one independently-controllable light-emitting element has at least two commonly-controlled portions that together emit substantially white light to form a white sub-pixel; and
   d) wherein the optical cavity of one or more of the commonly-controlled portions of the white sub-pixel comprises a plurality of optical microcavities, each optical microcavity tuned to emit light at a different complementary wavelength and emission angle.

2. The device of claim 1 wherein one of the commonly-controlled portions of the white sub-pixel emits substantially blue or cyan light at a normal angle with respect to the substrate and another of the commonly-controlled portions emits substantially yellow, orange, or red light at a normal angle with respect to the substrate.

3. The device of claim 2 wherein one of the commonly-controlled portions of the white sub-pixel emits light having a peak wavelength emission greater than 550 at a normal angle with respect to the substrate and another of the at-least-two commonly-controlled portions of the white sub-pixel emits light having a peak wavelength emission less than 500 nm at a normal angle with respect to the substrate.

4. The device of claim 1 further comprising a color filter formed over one of the commonly-controlled portions that transmits light emitted at a normal angle with respect to the substrate and absorbs light emitted at an angle other than the normal.

5. The device of claim 1 wherein one of the commonly-controlled portions of the white sub-pixel has a different sized-area from another of the commonly-controlled portions of the white sub-pixel.

6. The device of claim 1 wherein at least one of the commonly-controlled portions of the white sub-pixel is tuned to emit light at a peak wavelength different from the peak wavelengths of the colored sub-pixels.

7. The device of claim 1 wherein the emission of the white sub-pixel is tuned to emit light at a preferred device white-point.

8. The device of claim 1 wherein the emission of the white sub-pixel is tuned to emit light at a white-point other than a preferred white point of the device.

9. The device of claim 1 wherein the emission of the white sub-pixel is tuned to minimize the difference between the average emission of the white sub-pixel and a preferred device white-point at more than one angle.

10. The device of claim 1 wherein the wavelength of the light emitted from each of the commonly-controlled portions of the white sub-pixel changes at different viewing angles and wherein the white-point changes of the combined light emission from the commonly-controlled portions is smaller than the white-point change of at least one of the commonly-controlled portions.

11. The device of claim 1 wherein the optical cavities of the colored sub-pixels are tuned to an approximate peak wavelength corresponding to the peak transmission wavelength of the corresponding color filter.

12. The device of claim 1 wherein the optical microcavities of the white sub-pixels are tuned to one or more peak wavelengths approximately corresponding to the peak emission wavelengths of the white-light-emitting layer.

13. The device of claim 1 wherein the peak emission wavelengths of the white-light-emitting layer are matched to the peak transmission wavelength of the corresponding color filter.

14. The light-emitting diode device of claim 1 wherein the optical micro-cavities of the white sub-pixel are tuned to emit red, green, and blue light, or yellow and blue light, or red and cyan light, or orange and cyan light.

15. The light-emitting diode device of claim 1 wherein one of the commonly-controlled portions of the white sub-pixel is tuned to emit light having a peak wavelength greater than 550 at a normal angle and further comprising a color filter formed over the commonly-controlled portion of the white sub-pixel, the color filter absorbing a substantial amount of the light having a wavelength less than 550.

16. The light-emitting diode device of claim 1 wherein the white light-emitting layer emits light having a spectrum with two or more peaks.

17. The light-emitting diode device of claim 1, wherein the LED device is an information-display device.

18. The light-emitting diode device of claim 1, wherein the white light-emitting layer comprises organic materials or inorganic quantum dots formed in a poly-crystalline semiconductor matrix.

19. The device of claim 1 further comprising spacers interposed between the reflective electrode and the semi-transparent electrode.

20. The device of claim 1, wherein the at least two commonly-controlled portions include color filters operating with the at least two commonly-controlled portions.

21. A white light-emitting microcavity light-emitting diode device, comprising:
   a) a substrate;
   b) a reflective electrode and a semi-transparent electrode formed over the substrate and an unpatterned white-light-emitting layer formed between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements;
   c) a plurality of color filters formed over a side of the semi-transparent electrodes opposite the unpatterned white light-emitting-layer in correspondence with the independently-controllable light-emitting elements to form colored sub-pixels, the plurality of color filters having at least two different colors and wherein at least one independently-controllable light-emitting element has at least two commonly-controlled portions that together emit substantially white light to form a white sub-pixel; and
   d) wherein the optical cavity of one or more of the commonly controlled portions of the white sub-pixel comprises a plurality of optical microcavities, each optical microcavity tuned to emit light at a different complementary wavelength at multiple emission angles.

22. A method of making an LED device, comprising the steps of:
   a) providing a substrate;
   b) forming a reflective electrode and a semi-transparent electrode over the substrate and forming an unpatterned white-light-emitting layer between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements;
   c) forming a plurality of color filters over a side of the semi-transparent electrodes opposite the unpatterned white light-emitting-layer in correspondence with the independently-controllable light-emitting elements to form colored sub-pixels, the plurality of color filters having at least two different colors and wherein at least one independently-controllable light-emitting element has at least two commonly-controlled portions that together emit substantially white light to form a white sub-pixel; and
   d) wherein the optical cavity of one or more of the commonly-controlled portions of the white sub-pixel comprises a plurality of optical microcavities, each optical microcavity tuned to emit light at a different complementary wavelength at an emission angle.

* * * * *